United States Patent
Yang et al.

(10) Patent No.: US 9,218,881 B2
(45) Date of Patent: Dec. 22, 2015

(54) FLASH MEMORY BLOCKS WITH EXTENDED DATA RETENTION

(71) Applicant: SanDisk Technologies Inc., Plano, TX (US)

(72) Inventors: Nian Niles Yang, Mountain View, CA (US); Chris Nga Yee Avila, Saratoga, CA (US); Steven T. Sprouse, San Jose, CA (US)

(73) Assignee: SanDisk Technologies Inc., Plano, TX (US)

( * ) Notice: Subject to any disclaimer, the term of this patent is extended or adjusted under 35 U.S.C. 154(b) by 406 days.

(21) Appl. No.: 13/658,292

(22) Filed: Oct. 23, 2012

(65) Prior Publication Data

US 2014/0115230 A1      Apr. 24, 2014

(51) Int. Cl.
| | |
|---|---|
| G06F 12/00 | (2006.01) |
| G11C 16/04 | (2006.01) |
| G11C 16/34 | (2006.01) |
| H01L 27/115 | (2006.01) |
| G06F 12/02 | (2006.01) |
| G11C 7/20 | (2006.01) |

(52) U.S. Cl.
CPC .......... *G11C 16/0483* (2013.01); *G11C 16/349* (2013.01); *H01L 27/11524* (2013.01); *G06F 12/0238* (2013.01); *G06F 12/0246* (2013.01); *G11C 7/20* (2013.01); *Y10T 29/49002* (2015.01)

(58) Field of Classification Search
CPC ............ G06F 12/0246; G06F 12/0238; G11C 2211/5641; G11C 7/20
USPC ............................ 711/103, 104, 105, E12.008
See application file for complete search history.

(56) References Cited

U.S. PATENT DOCUMENTS

| | | | |
|---|---|---|---|
| 5,570,315 A | 10/1996 | Tanaka et al. | |
| 5,768,192 A | 6/1998 | Eitan | |
| 5,774,397 A * | 6/1998 | Endoh et al. | 365/185.19 |
| 6,011,725 A | 1/2000 | Eitan | |
| 6,046,935 A | 4/2000 | Takeuchi et al. | |
| 6,424,882 B2 | 7/2002 | Pierrat | |
| 6,556,471 B2 | 4/2003 | Chappell et al. | |
| 7,339,222 B1 | 3/2008 | Ding et al. | |
| 7,646,641 B2 * | 1/2010 | Chen et al. | 365/185.17 |

(Continued)

FOREIGN PATENT DOCUMENTS

| | | |
|---|---|---|
| KR | 2004 0061840 | 7/2004 |
| KR | 2010 0120787 | 11/2010 |

(Continued)

OTHER PUBLICATIONS

Notification of Transmittal of the International Search Report and the Written Opinion of the International Searching Authority, or the Declaration for Int'l Application No. PCT/US2013/065062 mailed Jan. 16, 2014, 12 pages.

(Continued)

*Primary Examiner* — Marchochee Chery
(74) *Attorney, Agent, or Firm* — Davis Wright Tremaine LLP

(57) ABSTRACT

A NAND flash memory chip includes a first partition that has smaller memory cells, with smaller charge storage elements, and a second partition that has larger memory cells, with larger charge storage elements, in the same memory array. Data is selected for storage in the first or second partition according to characteristics, or expected characteristics, of the data.

11 Claims, 7 Drawing Sheets

(56) References Cited

U.S. PATENT DOCUMENTS

| | | |
|---|---|---|
| 7,710,777 B1 | 5/2010 | Montierth et al. |
| 7,732,275 B2 * | 6/2010 | Orimoto et al. ............. 438/257 |
| 7,951,669 B2 * | 5/2011 | Harari et al. ................. 438/257 |
| 8,730,721 B2 * | 5/2014 | Camp et al. ............. 365/185.02 |
| 8,760,957 B2 * | 6/2014 | Lee et al. ................. 365/230.03 |
| 2005/0204212 A1 * | 9/2005 | Noguchi et al. ............. 714/710 |
| 2006/0250846 A1 | 11/2006 | Park |
| 2007/0004148 A1 | 1/2007 | Yang |
| 2008/0007999 A1 | 1/2008 | Park et al. |
| 2009/0044085 A1 | 2/2009 | Zeng |
| 2010/0034020 A1 | 2/2010 | Tanaka et al. |
| 2011/0222348 A1 * | 9/2011 | Kim et al. ................ 365/185.18 |
| 2012/0271985 A1 * | 10/2012 | Jeong et al. .................. 711/103 |
| 2014/0080299 A1 * | 3/2014 | Sel et al. ....................... 438/639 |

FOREIGN PATENT DOCUMENTS

| | | |
|---|---|---|
| KR | 1020100120787 | 11/2010 |
| WO | WO 2006/131915 | 12/2006 |
| WO | WO 2009/067138 | 5/2009 |
| WO | WO 2013/043602 | 3/2013 |

OTHER PUBLICATIONS

Eitan et al., "NROM: A Novel Localized Trapping, 2-Bit Nonvolatile Memory Cell," IEEE Electron Device Letters, vol. 21, No. 11, Nov. 2000, pp. 543-545.

Technical Search Report, Search date Aug. 16, 2012, pp. 1-7.

* cited by examiner

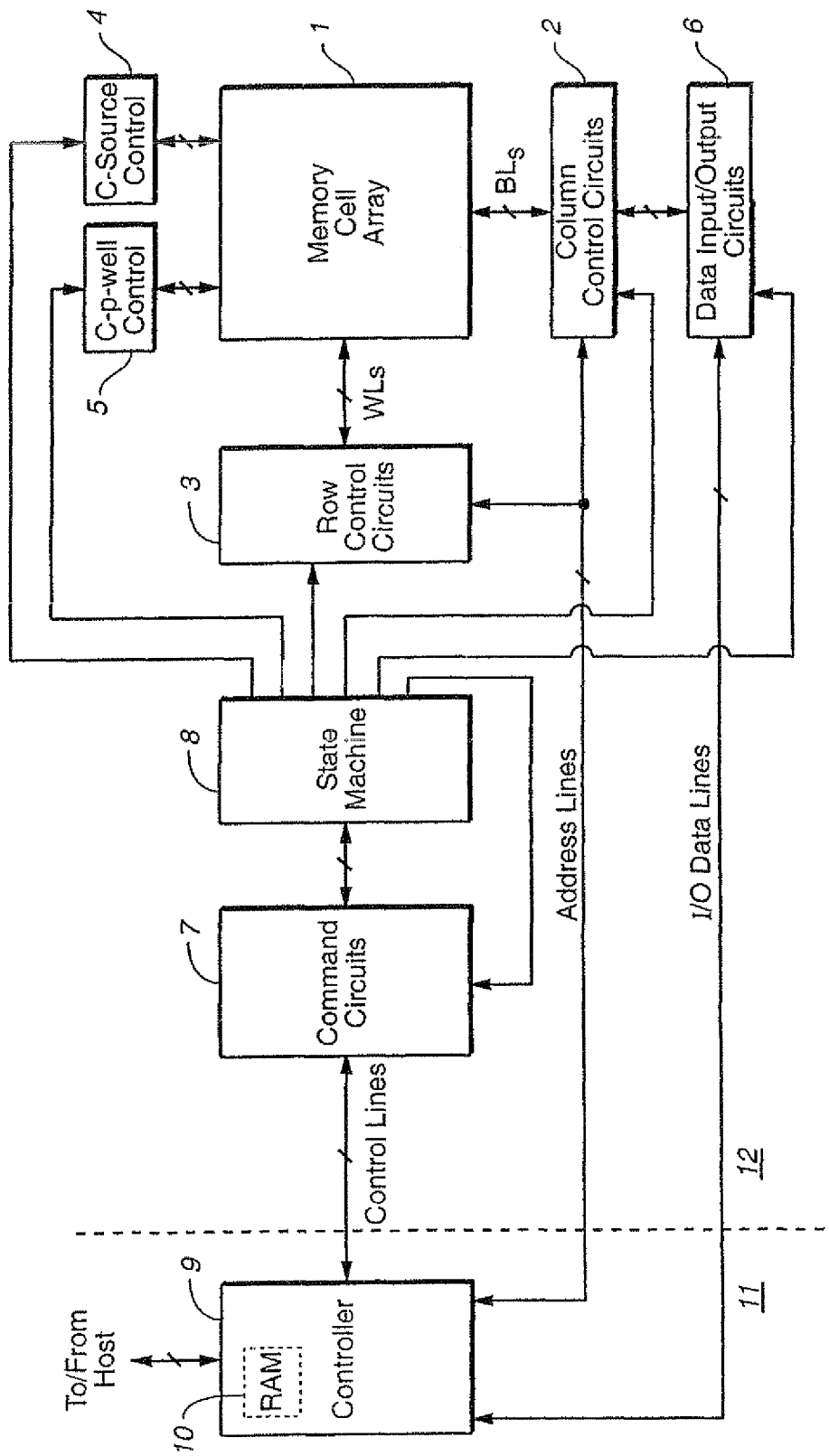
FIG._1
*(Prior Art)*

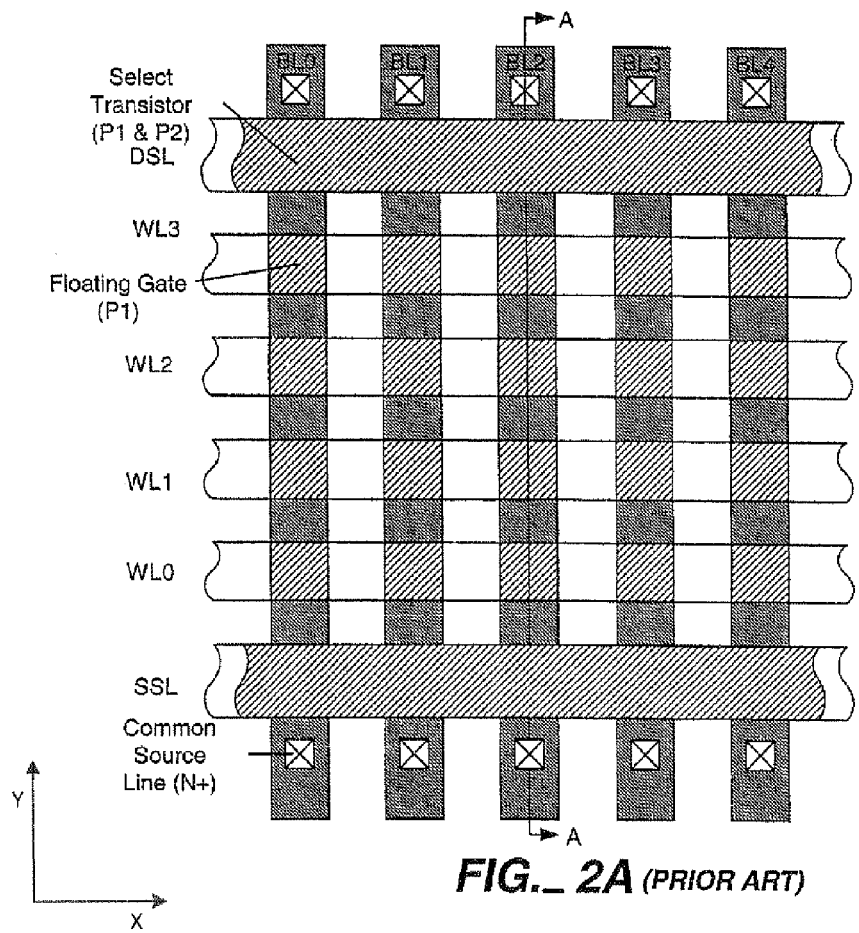
FIG._ 2A (PRIOR ART)
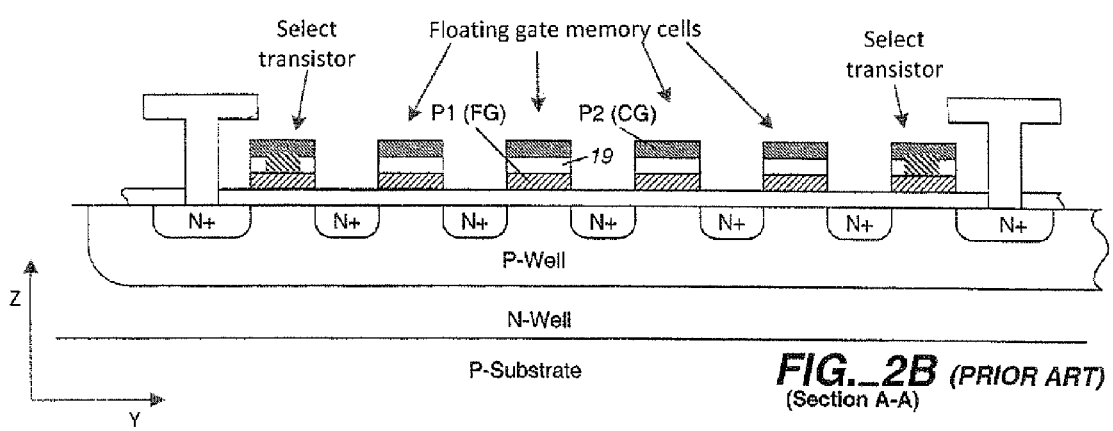
FIG._ 2B (PRIOR ART)
(Section A-A)

FLASH MEMORY BLOCKS WITH EXTENDED DATA RETENTION

BACKGROUND OF THE INVENTION

This invention relates generally to non-volatile semiconductor memories of the flash EEPROM (Electrically Erasable and Programmable Read Only Memory) type, their formation, structure and use, and specifically to a NAND flash memory cell array that includes a partition with higher data retention than other parts of the array.

There are many commercially successful non-volatile memory products being used today, particularly in the form of small form factor cards, which use an array of flash EEPROM cells. An example of a flash memory system is shown in FIG. 1, in which a memory cell array 1 is formed on a memory chip 12, along with various peripheral circuits such as column control circuits 2, row control circuits 3, data input/output circuits 6, etc.

One popular flash EEPROM architecture utilizes a NAND array, wherein a large number of strings of memory cells are connected through one or more select transistors between individual bit lines and a reference potential. A portion of such an array is shown in plan view in FIG. 2A. BL0-BL4 represent diffused bit line connections to global vertical metal bit lines (not shown). Although four floating gate memory cells are shown in each string, the individual strings typically include 16, 32 or more memory cell charge storage elements, such as floating gates, in a column. Control gate (word) lines labeled WL0-WL3 and string selection lines DSL and SSL extend across multiple strings over rows of floating gates. Control gate lines and string select lines are formed of polysilicon (polysilicon layer 2, or "poly 2," labeled P2 in FIG. 2B, a cross-section along line A-A of FIG. 2A). Floating gates are also formed of polysilicon (polysilicon layer 1, or "poly 1," labeled P1). The control gate lines are typically formed over the floating gates as a self-aligned stack, and are capacitively coupled with each other through an intermediate dielectric layer 19 (also referred to as "inter-poly dielectric" or "IPD") as shown in FIG. 2B. This capacitive coupling between the floating gate and the control gate allows the voltage of the floating gate to be raised by increasing the voltage on the control gate coupled thereto. An individual cell within a column is read and verified during programming by causing the remaining cells in the string to be turned on hard by placing a relatively high voltage on their respective word lines and by placing a relatively lower voltage on the one selected word line so that the current flowing through each string is primarily dependent only upon the level of charge stored in the addressed cell below the selected word line. That current typically is sensed for a large number of strings in parallel, thereby to read charge level states along a row of floating gates in parallel. Examples of NAND memory cell array architectures and their operation are found in U.S. Pat. Nos. 5,570,315, 5,774,397, 6,046,935, and 7,951,669.

Nonvolatile memory devices are also manufactured from memory cells with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

Like all integrated circuits, memory arrays tend to have smaller dimensions from one generation to the next. This creates several problems. One problem, in memory cells that use a charge storage element, is that smaller cells usually have shorter data retention times. As dimensions get smaller, this problem generally becomes more acute. Therefore, there is a need for a NAND flash memory array with high data retention and high memory cell endurance.

SUMMARY OF THE INVENTION

A NAND flash memory includes memory cells of at least two sizes, larger memory cells for selected data, and smaller memory cells for regular data. The larger memory cells have longer data retention time and data may be stored in larger memory cells where the data is particularly important and/or the data is to be maintained for a long time. The larger memory cells also have better endurance for read-write cycles and may be selected for frequently written data. Larger cells may be operated as a separate partition. Blocks may consist of either larger cells, or smaller cells, or may contain both.

An example of a NAND flash memory die includes: a first plurality of flash memory cells that include charge storage elements of a first physical size; and a second plurality of flash memory cells that include charge storage elements of a second physical size that is larger than the first physical size.

The first plurality of flash memory cells may individually have a charge storage element with a first dimension along a bit line direction, and the second plurality of flash memory cells may individually have a charge storage element with a second dimension along the bit line direction that is greater than the first dimension. The first dimension may be approximately equal to the minimum feature size of a patterning process used to form the NAND flash memory die. The charge storage elements of the first plurality of flash memory cells and the charge storage elements of the second plurality of flash memory cells may have a third dimension along a word line direction. The first plurality of flash memory cells may share bit lines with the second plurality of flash memory cells. The first plurality of flash memory cells may share a word line that has a width that is equal to the first dimension, and the second plurality of flash memory cells may share a word line that has a width that is equal to the second dimension.

An example of a method of operating a NAND flash memory die includes: identifying data to be stored in the NAND flash memory array according to at least one data property; storing data having a first data property in NAND flash memory cells that have charge storage elements of a first size; and storing data having a second data property in NAND flash memory cells that have charge storage elements of a second size that is greater than the first size.

The first data property may be that data is infrequently rewritten and the second data property may be that data is frequently rewritten. The data may be identified as frequently written when it comprises data management information including FAT, directory, or logical-to-physical mapping information. The first data property may be that data is not expected to be stored for a long period of time and the second data property may be that data is expected to be stored for a long period of time. The data may be identified as data expected to be stored for a long period of time when it comprises boot page, file system, or firmware data. The data having a first data property may be identified as not important, and the data having the second the second data property may be identified as important.

An example of a method of forming a NAND flash memory die includes: forming a first plurality of flash memory cells that include charge storage elements of a first physical size; and forming a second plurality of flash memory cells that include charge storage elements of a second physical size that is larger than the first physical size.

The first plurality of flash memory cells and the second plurality of flash memory cells may be formed using the same process steps and the same mask set. A mask of the mask set may define a first plurality of word lines having a first width, and may define a second plurality of word lines having a second width that is greater than the first width. Charge storage elements may be formed under word lines in a self-aligned stack, and the greater width of the second plurality of word lines may define a dimension of the charge storage elements of the second physical size that is larger than a corresponding dimension of the charge storage elements of the first physical size.

An example of a method of configuring a communication channel between a NAND flash memory die and a memory controller includes: initiating a power on process; sending cell size information from the NAND flash memory die to the memory controller, the cell size information identifying at least one physical address in the NAND flash memory die as corresponding to larger NAND flash memory cells than other physical addresses in the NAND flash memory die; and in response, selecting data to be sent to the at least one physical address based on at least one property of the data.

Additional aspects, advantages and features of the present invention are included in the following description of examples thereof, which description should be taken in conjunction with the accompanying drawings. All patents, patent applications, articles, technical papers and other publications referenced herein are hereby incorporated herein in their entirety by this reference.

BRIEF DESCRIPTION OF THE DRAWINGS

FIG. 1 is a block diagram of a prior art memory system.
FIG. 2A is a plan view of a prior art NAND array.
FIG. 2B is a cross-sectional view of the prior art NAND array of FIG. 2A taken along the line A-A.

DETAILED DESCRIPTION OF EXEMPLARY EMBODIMENTS

Memory System

Figure 3:
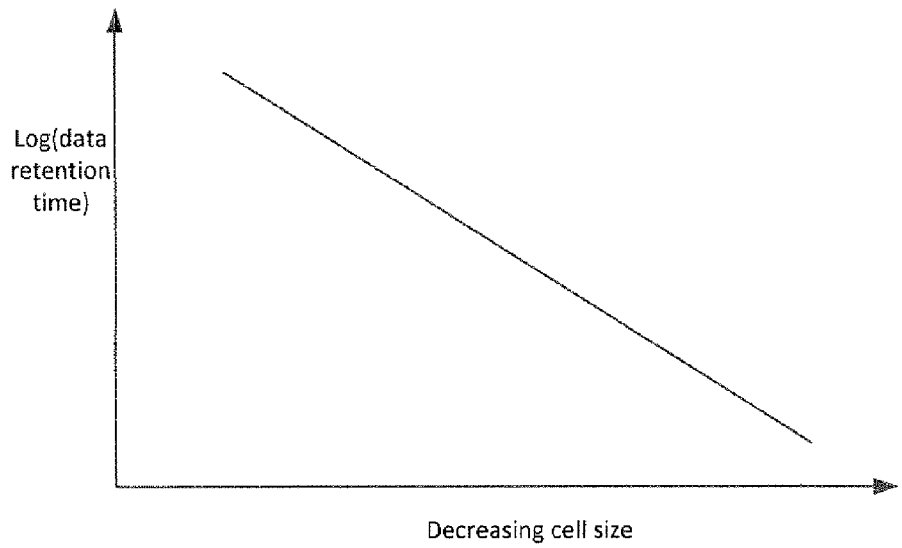
FIG. 3 shows flash memory data retention time as a function of cell size.

An example of a prior art memory system, which may be modified to include various aspects of the present invention, is illustrated by the block diagram of FIG. 1. A memory cell array 1 including a plurality of memory cells M arranged in a matrix is controlled by a column control circuit 2, a row control circuit 3, a c-source control circuit 4 and a c-p-well control circuit 5. The memory cell array 1 is, in this example, of the NAND type similar to that described above in the Background and in references incorporated therein by reference. A control circuit 2 is connected to bit lines (BL) of the memory cell array 1 for reading data stored in the memory cells (M), for determining a state of the memory cells (M) during a program operation, and for controlling potential levels of the bit lines (BL) to promote the programming or to inhibit the programming. The row control circuit 3 is connected to word lines (WL) to select one of the word lines (WL), to apply read voltages, to apply program voltages combined with the bit line potential levels controlled by the column control circuit 2, and to apply an erase voltage coupled with a voltage of a p-type region on which the memory cells (M) are formed. The c-source control circuit 4 controls a common source line (labeled as "c-source" in FIG. 1) connected to the memory cells (M). The c-p-well control circuit 5 controls the c-p-well voltage.

The data stored in the memory cells (M) are read out by the column control circuit 2 and are output to external I/O lines via an I/O line and a data input/output buffer 6. Program data to be stored in the memory cells are input to the data input/output buffer 6 via the external I/O lines, and transferred to the column control circuit 2. The external I/O lines are connected to a controller 9. The controller 9 includes various types of registers and other memory including a volatile random-access-memory (RAM) 10.

The memory system of FIG. 1 may be embedded as part of the host system, or may be included in a memory card, USB drive, or similar unit that is removably insertible into a mating socket of a host system. Such a card may include the entire memory system, or the controller and memory array, with associated peripheral circuits, may be provided in separate cards. Several card implementations are described, for example, in U.S. Pat. No. 5,887,145. The memory system of FIG. 1 may also be used in a Solid State Drive (SSD) or similar unit that provides mass data storage in a tablet, laptop computer, or similar device.

Many prior art memory systems contain a NAND flash memory array as shown in FIG. 2A and FIG. 2B. However, such memory arrays suffer from several problems. Some of these problems get worse as device sizes scale downwards.

One problem that occurs in NAND flash memory arrays is related to retention of data that is written in flash memory cells. In particular, after flash memory cells have been programmed to a particular memory state, and verified as being in that memory state, in a read-verify step, the cells may change over some period of time so that when they are read at a later time, their apparent states are not the states that were initially programmed. For example, electrical charge that is added to a floating gate or other charge storage element during programming may leak from the charge storage element over time. Such leakage of charge may eventually cause the memory state of the cell to be misread.

Problems of data retention become worse as memory cell sizes decrease. FIG. 3 shows log (data retention time) for decreasing memory cell size (cell size decreases from left to right). While smaller device sizes are required to produce a competitive product, such reduced sizes bring problems of data retention. As charge storage elements become smaller and smaller, the number of electrons stored becomes so small that even a few lost electrons may be significant. In particular, in MLC cells, where threshold voltage may be divided into eight, sixteen or more threshold voltage ranges, small changes in threshold voltage may cause misreading. Where charge storage elements are small, such changes in threshold voltage may be caused by just a few electrons leaking. For some memory designs, such data retention problems are not significant for minimum feature sizes of approximately 40 nanometers, but are significant for minimum feature sizes of approximately 20 nanometers. While it is desirable to take advantage of smaller device size to reduce cost, data retention is a significant problem, in particular for certain important data where misreading may have serious consequences.

Figure 4A:
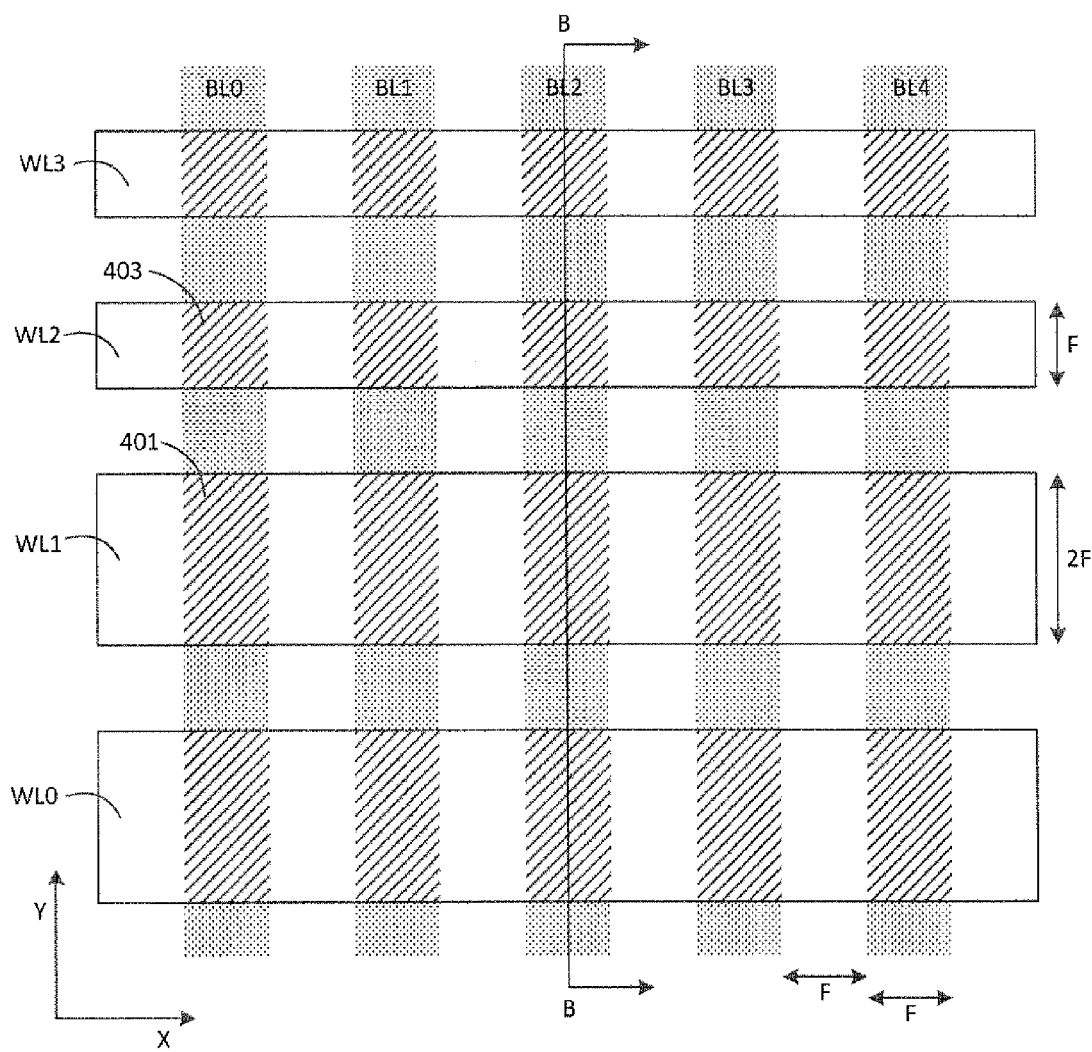
FIG. 4A shows a plan view of a NAND array according to an embodiment.
Figure 4B:
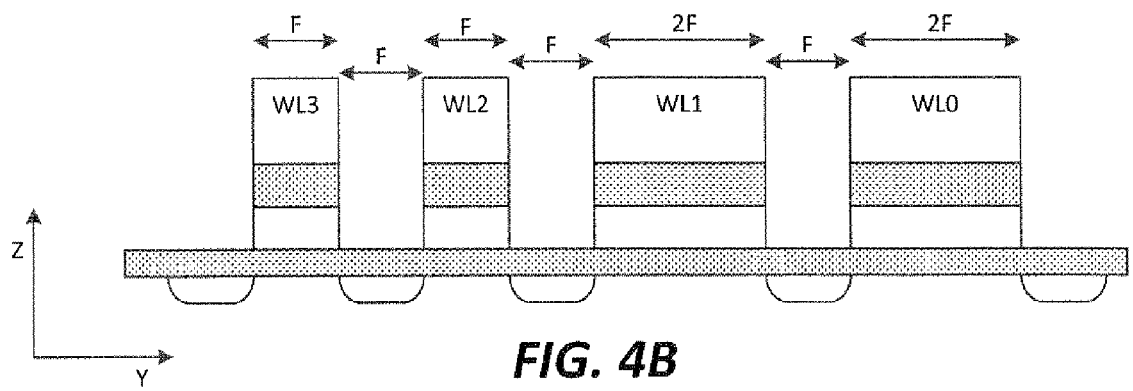
FIG. 4B shows a cross sectional view of the NAND array of FIG. 4A taken along the line B-B.

FIGS. 4A and 4B show two different views of a NAND flash memory according to an embodiment of the present invention. In particular, FIG. 4A shows word lines WL0-WL3 of two different sizes. Two word lines, WL2, WL4, have a width F, the minimum feature size of the process used. Also shown are two word lines, WL0, WL1, that have a width 2F, twice the minimum feature size. The width 2F is an example, and it will be understood that various sizes may be used in different embodiments.

Bit lines have a width F, so that the bit line pitch is 2F (i.e. pattern repeats with an offset of 2F from one pattern to the next in the x-direction of FIG. 4A). Charge storage elements, such as floating gates, are formed in a self-aligned manner with the overlying word lines where word lines overlie bit lines. This may be achieved by etching through a stack of materials that includes the word line material and the floating gate material using a single pattern. Thus, charge storage elements under wider word lines are larger than charge storage elements under smaller word lines as can be seen in FIG. 4A. For example, floating gate 401 under WL1 is larger than floating gate 403 under word line WL2, although both floating gates are along bit line BL0 and thus have the same x-dimension (dimension along the x-direction). Such larger charge storage elements have greater data retention time as indicated in FIG. 3. Thus, comparing memory cells along smaller word lines, WL2, WL4, with memory cells along wider word lines, WL0, WL1, it can be seen from FIG. 3 that the larger memory cells (with larger charge storage elements) along the wider word lines provide greater data retention time.

FIG. 4B shows a cross section along a plane indicated by B-B' in FIG. 4A. It can be seen that memory cells along wider word lines, WL0, WL1, are elongated in the bit line direction (Y-direction) as compared with memory cells along narrower word lines, WL2, WL3. Spacing between word lines is shown as being uniform both between narrower word lines, between a narrow word line and a wider word line, and between wider word lines. In this example, the spacing between all word lines is F, the minimum feature size. However, in other examples, such spacing may also be modified and is not necessarily uniform. For example, the spacing between narrower word lines (with width F) may be F, while the spacing between wider word lines (with width 2F) may be larger, for example, 2F. This may provide less cell-to-cell coupling and interference which is generally desirable and may be worth the additional space.

It can be seen that two different types of memory cell are formed in the same memory array, and that these two different types of memory cells have different characteristics. Smaller cells are cheaper (i.e. more cells can be formed in a given area and marginal cost per cell is lower). Larger cells have longer data retention time. Larger memory cells may also wear more slowly. Thus, while smaller memory cells may on average wear out after N write-erase cycles, larger memory cells may wear out after L*N write-erase cycles, where L is greater than 1 (e.g. L=10). A memory may take advantage of both types of memory cell by selecting where data is to be stored based on properties of the data to be stored.

In an embodiment, a memory system operates larger memory cells as a separate partition within the memory array. Such a partition may be referred to as a Data Retention (DR) partition because data retention is a characteristic of particular interest. However, this partition has other characteristics, and aspects of the present invention relate to characteristics other than data retention. For example, such a partition has greater endurance for write-erase cycles and may have other characteristics. Thus the term "data retention partition" or "DR partition" should not be considered narrowly, and may refer to a partition that has other characteristics than simply data retention characteristics.

Where a memory includes a DR partition formed of larger memory cells, a memory system may take advantage of the benefits of such larger cells for particular data, while taking advantage of the relatively low cost of smaller cells for other data. According to an embodiment, data that is to be stored for a long period of time is identified and is stored in a DR partition.

Figure 5:
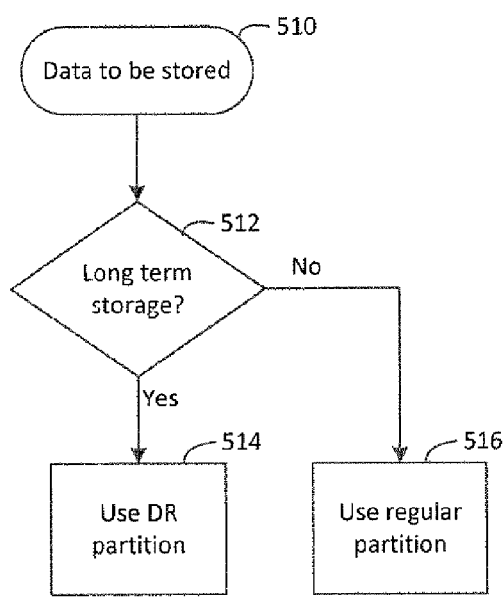
FIG. 5 shows a scheme for selecting data to store in a DR partition according to the time period that the data is expected to be stored.

FIG. 5 shows a flowchart for a process of determining where data is to be stored 510 in a memory array that includes a DR partition. A determination is made 512 as to whether the data is likely to be stored for a long period of time. This determination may be made by a host, or by a memory controller. The determination may be made on the basis of the nature of the data to be stored. For example, a firmware update is an example of data that is likely to be stored for a long period (firmware updates should be relatively infrequent compared with user data updates). Therefore, because updated firmware data is likely to be stored for a long period, it is stored in the DR partition 514. Other data that is not likely to be stored for a long period is stored in a regular partition 516.

Because larger memory cells have greater endurance than regular memory cells, they may be used for more frequently written data. Thus, by concentrating wear in memory cells that have greater tolerance for wear, the overall life expectancy of the device is increased.

Figure 6:
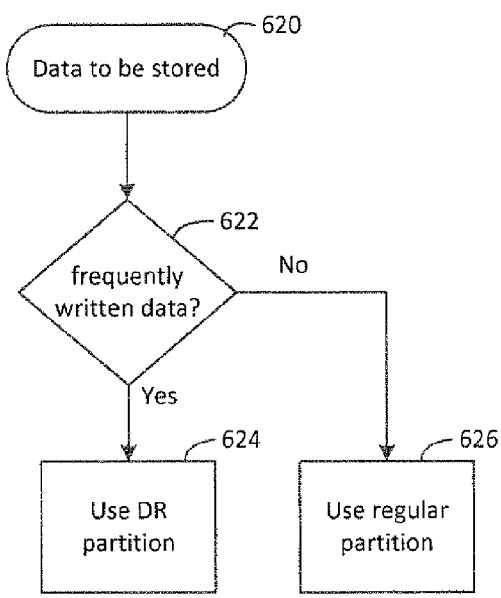
FIG. 6 shows a scheme for selecting data to store in a DR partition according to the frequency with which the data is written.

FIG. 6 shows a flowchart for a process of determining where data is to be stored 620 in a memory array that includes a DR partition. A determination is made 622 as to whether the data is frequently written. This determination may be made by a host, or by a memory controller and may be based on the nature of the data to be stored. For example, directory, File Allocation Table (FAT), logical-to-physical mapping, and other data management structures are subject to frequent updating in some systems. Such data management structures may be stored in the DR partition 624 so that the wear produced by their frequent updating is confined to the DR partition. Data that is not frequently written is assigned to a regular partition 626. In this way, wear on regular memory cells (which have lower endurance) is reduced.

Data may also be identified as likely to be frequently written based on history (i.e. data that has been frequently written in the past may be assumed to be frequently written in future). For example, if a particular logical address is updated more than a predetermined number of times in a specified period, then that logical address may be considered to correspond to frequently updated data. The logical address may then be assigned to the DR partition. If data that was previously identified as frequently written, and was assigned to the DR partition, is no longer frequently written (not updated for a predetermined period of time) then that data may no longer be considered as frequently written and may be reassigned to a regular partition. Thus, the DR partition stores some "hot" data, where the data considered "hot" may be different over time.

Because data stored in a DR partition has a lower probability of being corrupted over a given period of time, data may be chosen for storage in a DR partition on the basis of the importance of the data. For example, data that is considered important (e.g. where its loss might cause the entire memory device to fail) may be stored in a DR partition. Data that is not considered particularly important may be stored in a regular partition. Examples of data that may be considered particularly important include boot page, firmware, and file storage data.

Figure 7:
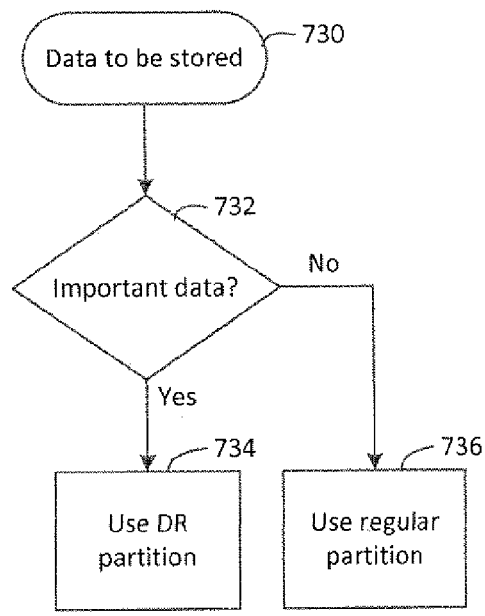
FIG. 7 shows a scheme for selecting data to store in a DR partition according to the importance of the data.

FIG. 7 shows a flowchart for a process of determining where data is to be stored 730 in a memory array that includes a DR partition. A determination is made 732 as to whether the data is important. This determination may be made by a host, or by a memory controller, and may be based on the nature of the data to be stored. For example, boot page, file system data, and firmware may be considered important. Such data may be stored in the DR partition 734 where they are less likely to be lost in a given period of time. Data that is not important is assigned to a regular partition 736.

While the above three factors (expected time of storage, frequency of writing, and importance) for choosing where to store data are shown separately, a scheme for choosing where to store data may use a combination of these, and may also use other factors. Thus, for example, a DR partition may be used for both long term storage and for frequently written data (storing data at both extremes). Some internal wear-leveling may be used to even out wear in such a DR partition. To some extent, some of these factors may overlap (e.g. firmware may be considered important and may also be stored for long periods). Thus, a scheme may be chosen based on the physical characteristics of the partitions available (size, data retention characteristics, etc.) and on the nature of the data to be stored, based on any number of factors.

In some cases, a host may be aware of different partitions including a DR partition and may determine where particular data is to be stored. For example, a host may indicate that a particular logical address range is to be assigned to a DR partition. In other examples, a memory system may operate a DR partition without the host being aware of the DR partition. Such a memory system may map host data to a DR partition, or regular partition, as part of logical-to-physical mapping, without informing the host that data is being treated differently. Such a memory system may also store certain other data, which is not received from the host, in a DR partition (e.g. data generated by a memory controller).

Figure 8:
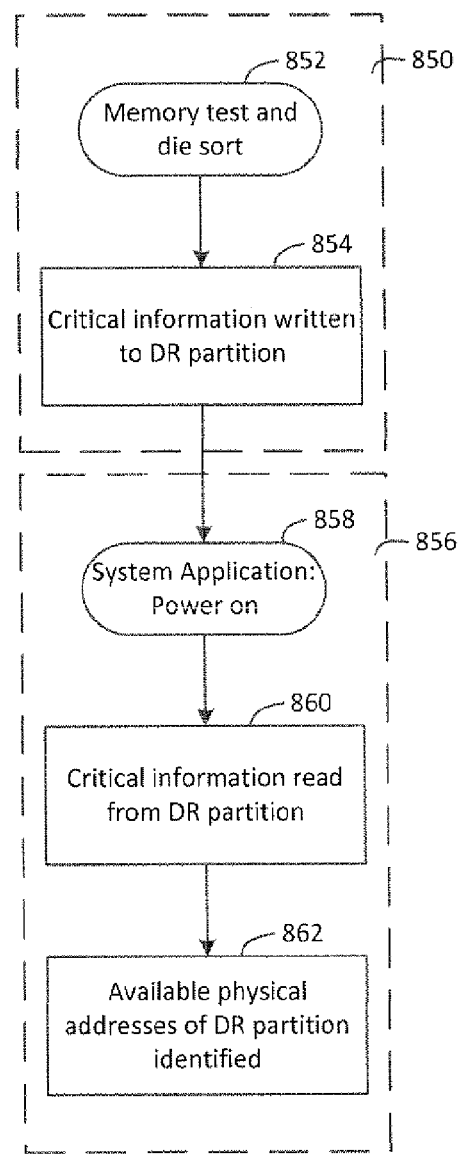
FIG. 8 shows an initialization procedure for a memory system and subsequent power on procedure.

A DR partition may be configured during a factory initialization procedure 850 as shown in FIG. 8. A memory test and die sort procedure 852 is carried out on all memory systems prior to being shipped to users. Critical information may be written to a DR partition 854 at this time. For example, firmware to operate the memory controller may be stored in the DR partition. In some memory systems, device ID related information is written to the memory device during this procedure. One or more bytes may be reserved for such information at a predetermined address, or address range. Information regarding a DR partition, such as the size and location of the DR partition, may be written in such device ID bytes. Because of the importance of device ID information, and the long time it will be stored (throughout the device lifetime) this data may itself be stored in a DR partition. After this initialization procedure is complete, the memory may be shipped to an end user.

FIG. 8 shows a procedure 856 that occurs when a user powers up the memory system. A power on routine is initiated 858 and the critical information that was stored in the DR partition during initialization is read from the DR partition 860. For example, when the memory system initially receives a voltage above a certain minimum, the memory system may perform a Power On Read (POR) to read critical information. The device ID bytes, including any information regarding a DR partition, are read at this time so that the memory system (and in some cases, the host) learn the location and characteristics of the DR partition. In general, critical information does not occupy the entire DR partition and some additional space is available. This available physical space is identified 862 so that the memory controller knows how much data can be stored in the DR partition and can use an appropriate scheme to determine where to store data. Information regarding the available space in the DR partition may also be sent to a host where appropriate.

Figure 9:
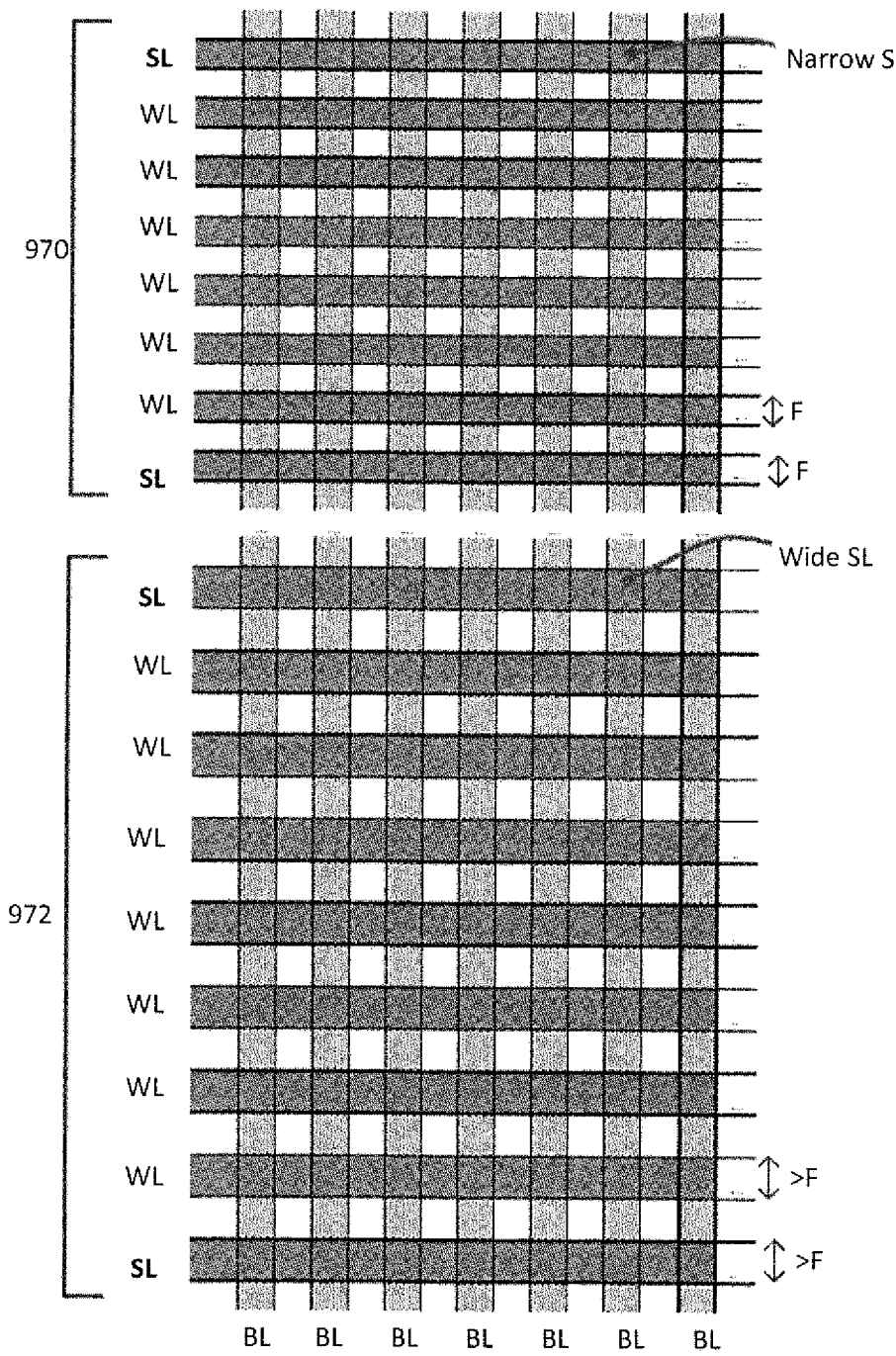
FIG. 9 shows a DR partition block containing larger cells, and a normal block containing smaller cells.

FIG. 9 shows an example of a physical arrangement of a DR partition and a normal partition. In this example, bit lines are shared between a normal block 970 and a DR partition block 972. A normal block is shown with word lines and select lines that have a width F (i.e. select lines have same width as word lines in normal block). A DR partition block is shown with word lines and select lines that have a width that is greater than F (i.e. select lines have same width as word lines in DR partition block). In this case, select lines are wider in the DR partition block, although in other examples, select lines may be the same for all blocks because select transistors (which do not have floating gates) do not benefit from larger size in the same manner that memory cells do. In contrast to FIGS. 4A and 4B, here an individual block contains only one size of memory cell (either regular or larger). There are no blocks with both regular sized cells and larger cells. This avoids having partition boundaries within blocks, with one part of a block in one partition and another part of the block in a different partition. However, both arrangements are possible. While FIG. 9 shows a relatively small number of word lines in both blocks, and a relatively small number of bit lines, it will be understood that real memory systems may have large numbers of word lines in a block (e.g. 64 or more) and may have large numbers of bit lines. In some cases, DR partition blocks may have fewer word lines than regular blocks so that DR partition blocks are the same size as normal blocks. In other cases, the number of word lines is the same for both DR partition blocks and normal blocks so that DR partition blocks are larger than normal blocks. Individual row control circuits (e.g. portions of row control circuits 3 of FIG. 1) may be larger for the DR partition word lines because of the additional space available (i.e. increased pitch of word lines along bit line direction provides increased area for row control circuits connected to the word lines). Larger transistors in such decoding circuits may have larger current capacity and so can charge-up word lines faster, and discharge word lines faster, than smaller transistors.

Figure 10:
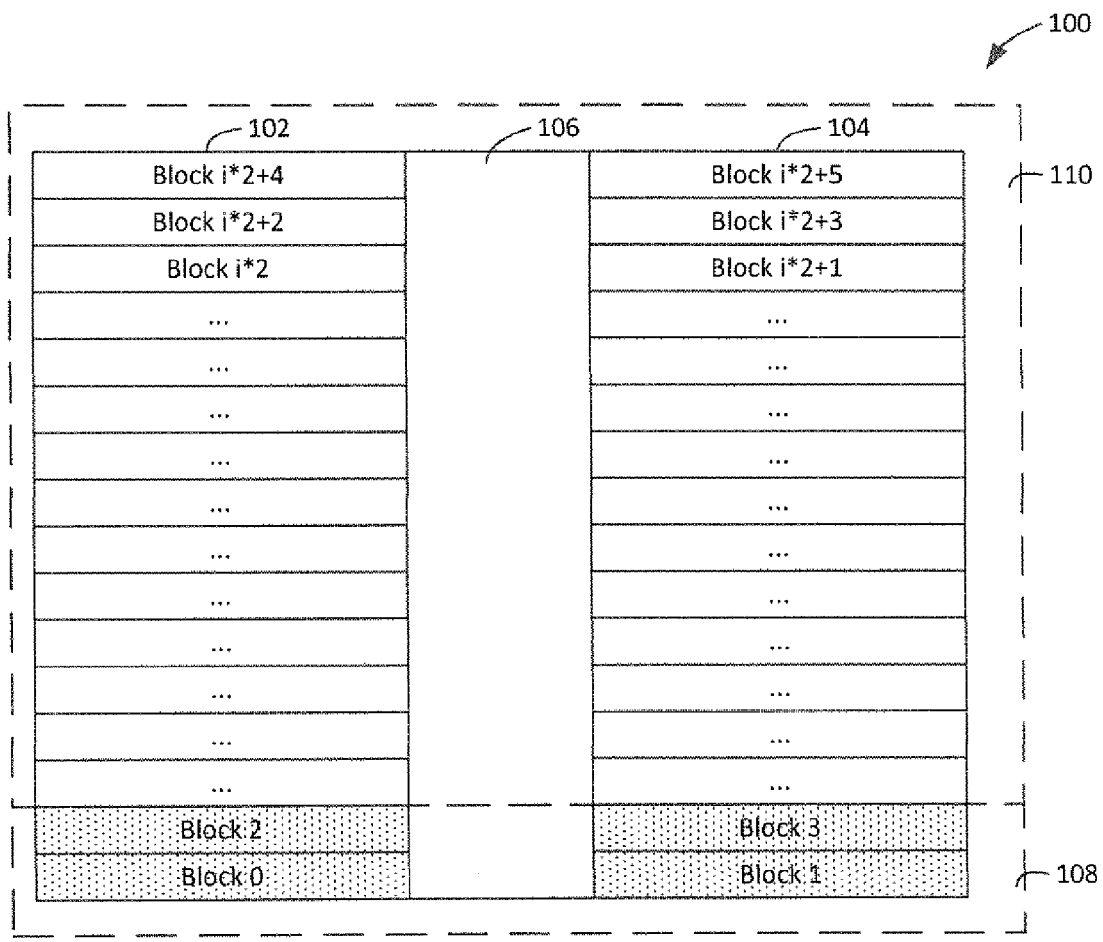
FIG. 10 shows a two-plane die with blocks divided into a DR partition and normal partition.

FIG. 10 shows an example of physical arrangement of blocks in a memory die 100. In this example, two planes, 102, 104, are provided with common row decoding circuits 106. Each plane contains many blocks. The blocks form two partitions, a DR partition 108 consisting of two blocks from each plane, blocks 0-3 (four blocks in total), and a normal partition 110 that consists of the remaining blocks of die 100. These two partitions may be operated according to a scheme as described above, or other scheme, to assign data to a partition according to the nature of the data. It can be seen that the DR partition 108 forms a relatively small portion of the overall memory array so that the extra space occupied by a DR partition block (as compared with a normal block) does not greatly increase overall die size. For example, by increasing the width of a word line by 25% in the DR partition (as compared with a normal partition), and using 10 out of 2024 blocks in a memory die to form the DR partition, the increase in die size is approximately an extra 0.12%. Increasing the size of memory cells in the DR partition by 25% provides an increase of approximately 200% in data retention in the DR partition compared with the normal partition. Thus, the availability of such reliable storage for certain data far outweighs the small increase in size.

While the above examples show two types of memory cells, and two partitions, aspects of the present invention may apply to three or more sizes of memory cells, or to three or more partitions, or both. For example, three different sizes of memory cells may be used to form three different partitions with each partition having memory cells of uniform size. Regular data may be stored in one partition (e.g. partition with smallest cells), more important, or more frequently written data may be stored in a second partition (e.g. partition with mid-sized cells), and most important, or most frequently written data may be stored in a third partition (e.g. partition with largest memory cells). Further partitioning may also be used where convenient so that there may be multiple partitions with memory cells of any given size (e.g. multiple partitions with smallest cells). While the smallest cells may be cells with the minimum feature size of the lithographic process used to form the memory array, this may not always be the case. Cell size may be selected according to requirements, and the cells may all be larger than the minimum feature size in some cases.

In some cases, a double patterning process or other technique may be used to form elements that are smaller than the smallest element that can be formed by direct lithographic patterning. Examples of such double patterning are described in U.S. Pat. Nos. 7,655,536 and 7,960,266. Aspects of the present invention are applicable to memory arrays formed in such a manner. Thus, the minimum feature size is not necessarily the minimum feature size achievable by direct lithographic patterning; it may be the minimum feature size achievable using some additional techniques to make even smaller features. For example, where F is the minimum feature size achievable by direct lithographic patterning, narrow word lines may have a width of F/2, while other word lines have a greater width. Bit lines may be formed by direct patterning in such examples (i.e. bit line width=F) or may be formed in some other way.

While the above examples refer to a "normal" partition, this refers to the relative size of memory cells, and the term "normal" is not intended to limit such a partition to any other characteristic. The term DR partition generally refers to a partition that uses larger memory cells than used in a normal partition. However, a DR partition may also use additional techniques to improve data retention in a DR block. For example, SLC storage may be used instead of MLC storage, a greater degree of redundancy may be used for ECC, more frequent data scrubbing may be used, and a different read-verify scheme may be used to minimize effects of cell-to-cell coupling or other effects. Thus, a DR partition may be configured to employ additional techniques to improve data retention in comparison with a normal partition.

Conclusion

Although the various aspects of the present invention have been described with respect to exemplary embodiments thereof, it will be understood that the present invention is entitled to protection within the full scope of the appended claims. Furthermore, although the present invention teaches the method for implementation with respect to particular prior art structures, it will be understood that the present invention is entitled to protection when implemented in memory arrays with architectures than those described.

It is claimed:

1. A NAND flash memory system comprising:
   a first block of flash memory cells in a NAND flash memory die, each flash memory cell of the first block including a charge storage element of a first physical size;
   a second block of flash memory cells in a data retention partition of the NAND flash memory die, each flash memory cell of the second block including a charge storage element of a second physical size that is larger than the first physical size, the second block storing critical information that is stored during a factory initialization procedure and is read in a Power on Read (POR); and
   a memory controller that is configured to receive cell size information from the NAND flash memory die, the cell size information identifying at least an address of the second block as corresponding to larger flash memory cells, and to select data to be sent to the address of the second block based on at least one property of the data.

2. The NAND flash memory die of claim 1 wherein the first block of flash memory cells individually have a charge storage element with a first dimension along a bit line direction, and the second block of flash memory cells individually have a charge storage element with a second dimension along the bit line direction that is greater than the first dimension.

3. The NAND flash memory die of claim 2 wherein the first dimension is approximately equal to the minimum feature size of a patterning process used to form the NAND flash memory die.

4. The NAND flash memory die of claim 3 wherein charge storage elements of the first block of flash memory cells and the charge storage elements of the second block of flash memory cells have a third dimension along a word line direction.

5. The NAND flash memory die of claim 4 wherein the first block of flash memory cells share bit lines with the second block of flash memory cells.

6. The NAND flash memory die of claim 2 wherein the first block of flash memory cells are coupled to a first plurality of word lines that each have a width that is equal to the first dimension, and the second block of flash memory cells are coupled to a second plurality of word lines that each have a width that is equal to the second dimension.

7. A method of operating a NAND flash memory die that is in communication with a memory controller, comprising:
   initiating a power on process that includes a Power On Read (POR) to read critical information from the NAND flash memory die, the POR reading the critical information from a data retention partition in which all memory cells are NAND flash during a factory initialization procedure;
   sending cell size information from the NAND flash memory die to the memory controller, the cell size information identifying at least one physical address in the NAND flash memory die as corresponding to NAND flash memory cells of the larger size that are larger than NAND flash memory cells of a smaller size at other physical addresses in the NAND flash memory die; and in response, selecting data to be sent to the at least one physical address based on identifying data to be stored in the NAND flash memory as either data that is infrequently rewritten or data that is frequently rewritten;

storing data that is identified as infrequently rewritten in NAND flash memory cells of the smaller size; and storing data that is identified as frequently rewritten at the at least one physical address in the NAND flash memory die corresponding to NAND flash memory cells of the larger size.

8. The method of claim 7 wherein data is identified as frequently rewritten when it comprises data management information including FAT, directory, or logical-to-physical mapping information.

9. The method of claim 8 wherein data is identified as infrequently rewritten when it comprises boot page, or firmware data.

10. A method of configuring a communication channel between a NAND flash memory die and a memory controller comprising:

initiating a power on process;

sending cell size information from the NAND flash memory die to the memory controller, the cell size information identifying at least one physical address in the NAND flash memory die as corresponding to larger NAND flash memory cells than other physical addresses in the NAND flash memory die;

in response, selecting data to be sent to the at least one physical address based on at least one property of the data; and wherein the power on process includes a Power On Read (POR) to read critical information from the NAND flash memory die, the POR reading the critical information from a data retention partition in which all memory cells are larger NAND flash memory cells, the critical information stored at a predetermined address during a factory initialization procedure.

11. The method of claim 10 wherein the selecting data to be sent to the at least one physical address based on at least one property of the data comprises:

selecting, by the memory controller, frequently rewritten data for storage in the data retention partition; and selecting, by the memory controller, infrequently rewritten data for storage outside of the data retention partition in NAND flash memory cells.

\* \* \* \* \*

UNITED STATES PATENT AND TRADEMARK OFFICE
CERTIFICATE OF CORRECTION

PATENT NO. : 9,218,881 B2
APPLICATION NO. : 13/658292
DATED : December 22, 2015
INVENTOR(S) : Yang et al.

It is certified that error appears in the above-identified patent and that said Letters Patent is hereby corrected as shown below:

IN THE CLAIMS

Column 10, line 61, after "NAND flash" please insert -- memory cells of a larger size, the critical information stored at a predetermined address" --.

Signed and Sealed this
Twenty-sixth Day of April, 2016

Michelle K. Lee
*Director of the United States Patent and Trademark Office*